(12) United States Patent
Horita et al.

(10) Patent No.: US 10,236,925 B2
(45) Date of Patent: Mar. 19, 2019

(54) HIGH FREQUENCY FRONT-END CIRCUIT AND COMMUNICATION DEVICE

(71) Applicant: Murata Manufacturing Co., Ltd., Kyoto (JP)

(72) Inventors: Atsushi Horita, Kyoto (JP); Takaya Wada, Kyoto (JP); Hirokazu Nakae, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 95 days.

(21) Appl. No.: 15/631,711

(22) Filed: Jun. 23, 2017

(65) Prior Publication Data

US 2017/0302317 A1    Oct. 19, 2017

Related U.S. Application Data

(63) Continuation of application No. PCT/JP2015/085012, filed on Dec. 15, 2015.

(30) Foreign Application Priority Data

Dec. 26, 2014   (JP) .................................. 2014-263750

(51) Int. Cl.
*H04B 1/00* (2006.01)
*H04B 1/18* (2006.01)
(Continued)

(52) U.S. Cl.
CPC .............. *H04B 1/18* (2013.01); *H03H 7/075* (2013.01); *H03H 7/38* (2013.01); *H03H 7/46* (2013.01);
(Continued)

(58) Field of Classification Search
CPC ...... H04B 1/0057; H04B 1/0064; H04B 1/18; H04B 3/21; H04W 88/06; H04M 9/00; H04J 3/00
See application file for complete search history.

(56) References Cited

U.S. PATENT DOCUMENTS

2011/0212747 A1     9/2011   Qin et al.
2011/0299431 A1*   12/2011   Mikhemar ............... H04B 1/18
                                                          370/277
(Continued)

FOREIGN PATENT DOCUMENTS

JP      2002-141828 A    5/2002
JP      2002-185356 A    6/2002
JP      2012-044290 A    3/2012

OTHER PUBLICATIONS

International Search Report issued in Patent Application No. PCT/JP2015/085012 dated Mar. 8, 2016.
(Continued)

*Primary Examiner* — Mohamed A Kamara
(74) *Attorney, Agent, or Firm* — Pearne & Gordon LLP

(57) ABSTRACT

A front-end circuit includes an antenna terminal, front-end terminals (Pfe1, Pfe2), a circulator, and frequency-variable filters. The circulator sends transmission signals of communication bands of a frequency division duplex system and a time division duplex system from the front-end terminal (Pfe1) to the antenna terminal. The circulator sends a reception signal from the antenna terminal to the front-end terminal (Pfe2). The frequency-variable filter is connected between the front-end terminal (Pfe1) and the circulator, passes transmission signals of the frequency division duplex system and the time division duplex system, and attenuates signals other than the above transmission signals. The frequency-variable filter is connected between the circulator and the front-end terminal (Pfe2), passes a reception signal
(Continued)

of the frequency division duplex system, and attenuates signals other than the above reception signal.

11 Claims, 7 Drawing Sheets

(51) Int. Cl.
    *H04B 1/40*     (2015.01)
    *H03H 7/075*     (2006.01)
    *H03H 7/38*     (2006.01)
    *H03H 7/46*     (2006.01)
    *H03H 9/145*     (2006.01)

(52) U.S. Cl.
    CPC ............... *H03H 9/145* (2013.01); *H04B 1/00* (2013.01); *H04B 1/0057* (2013.01); *H04B 1/0064* (2013.01); *H04B 1/40* (2013.01)

(56) References Cited

U.S. PATENT DOCUMENTS

| | | |
|---|---|---|
| 2012/0208591 A1 | 8/2012 | Uejima |
| 2014/0024329 A1* | 1/2014 | Khlat ..................... H04B 1/10 |
| | | 455/307 |
| 2015/0056941 A1* | 2/2015 | Lin ........................ H04B 1/18 |
| | | 455/352 |

OTHER PUBLICATIONS

Written Opinion issued in Patent Application No. PCT/JP2015/085012 dated Mar. 8, 2016.

* cited by examiner

HIGH FREQUENCY FRONT-END CIRCUIT AND COMMUNICATION DEVICE

This is a continuation of International Application No. PCT/JP2015/085012 filed on Dec. 15, 2015 which claims priority from Japanese Patent Application No. JP2014-263750 filed on Dec. 26, 2014. The contents of these applications are incorporated herein by reference in their entireties.

BACKGROUND

Technical Field

The present disclosure relates to high frequency front-end circuits provided in transmitter-receiver devices configured to transmit and receive high frequency signals.

A large number of communication bands are available in wireless communication terminals such as cellular phones and the like these days. Bands of a time division duplex communication system (TDD system) and a frequency division duplex system (FDD system) are included in those communication bands.

In the current wireless communication terminals, antennas dedicated to each frequency band are not prepared, but a shared antenna is generally used by a plurality of communication bands. As such, in general, a duplexer circuit is provided in a front-end circuit of a wireless communication terminal.

For example, a front-end circuit disclosed in Patent Document 1 includes an antenna (shared antenna), a switch circuit, a duplexer to separate communication signals of the FDD system, a filter for a transmission signal of the TDD system, and a filter for a reception signal of the TDD system. The switch circuit connects the antenna and the duplexer when transmission-reception operation of the FDD system is performed. The switch circuit connects the antenna to the filter for a transmission signal when transmission operation of the TDD system is performed. Further, the switch circuit connects the antenna to the filter for a reception signal when reception operation of the TDD system is performed.

Patent Document 1: Japanese Unexamined Patent Application Publication No. 2002-185356

BRIEF SUMMARY

However, in the case where the number of communication bands using the shared antenna increases, the number of ports of the switch and the number of duplexers and filters unfavorably increase corresponding to the increased number of communication bands. Because of this, as the number of communication bands transmitted and received by the front-end circuit increases, the size of the circuit proportionally becomes larger. In particular, even if the FDD system in which transmission and reception frequencies differ from each other and the TDD system in which transmission and reception frequencies are the same attempt to use a shared circuit, it is difficult to simply integrate the respective circuits because a duplexer circuit of a frequency separation type cannot separate a transmission signal and a reception signal of the TDD system, and so on. This makes it difficult to miniaturize the front-end circuit.

The present disclosure provides a compact front-end circuit capable of transmitting and receiving communication bands of the FDD system and the TDD system.

A high frequency front-end circuit according to the present disclosure includes a first antenna terminal, a first front-end terminal, a second front-end terminal, a transmission-reception duplexer circuit, a first frequency-variable filter, a second antenna terminal, and a third front-end terminal. A transmission signal of a communication band of a time division duplex system and a transmission signal of a communication band of a frequency division duplex system are outputted through the first antenna terminal, and a reception signal of a communication band of the frequency division duplex system is inputted through the first antenna terminal. A transmission signal of a communication band of the time division duplex system and a transmission signal of a communication band of the frequency division duplex system are inputted through the first front-end terminal. A reception signal of a communication band of the frequency division duplex system is outputted through the second front-end terminal. The transmission-reception duplexer circuit sends the transmission signals inputted through the first front-end terminal to the first antenna terminal, and sends the reception signal inputted through the first antenna terminal to the second front-end terminal. The first frequency-variable filter is connected between the first front-end terminal and the transmission-reception duplexer circuit or included in the transmission-reception duplexer circuit. A reception signal of a communication band of the time division duplex system is inputted through the second antenna terminal. A reception signal of a communication band of the time division duplex system is outputted through the third front-end terminal. Further, the first frequency-variable filter passes a transmission signal of a communication band of the frequency division duplex system and a transmission signal of a communication band of the time division duplex system, and attenuates signals other than the transmission signal of the communication band of the frequency division duplex system and the transmission signal of the communication band of the time division duplex system.

In this configuration, since a transmission frequency and a reception frequency of the communication band of the time division duplex system are in the same frequency band, separate antennas are prepared for the transmission side and the reception side, respectively, of the communication band of the time division duplex system. Then, one of the stated antennas is connected to a reception circuit of the communication band of the time division duplex system, while the other antenna is connected to a circuit in which a transmission circuit of the communication band of the time division duplex system and a transmission-reception circuit of the communication band of the frequency division system are integrated.

In order to configure a circuit in which a transmission circuit of the communication band of the time division duplex system and a transmission-reception circuit of the communication band of the frequency division duplex system are integrated, a frequency-variable filter is connected between the transmission-reception duplexer circuit and a front end terminal configured to output the transmission signal of the communication band of the time division duplex system and the transmission signal of the communication band of the frequency division duplex system.

The stated frequency-variable filter passes the transmission signal of the communication band of the frequency division duplex system and the transmission signal of the communication band of the time division duplex system, and attenuates signals other than the transmission signal of the communication band of the frequency division duplex system and the transmission signal of the communication band of the time division duplex system. Through this, the communication band of the frequency division duplex system and the communication band of the time division duplex system can be transmitted and received, and the circuit size is maintained to be compact even if the number of communication bands increases.

Because the antenna for the transmission signal of the communication band of the time division duplex system and the antenna for the reception signal thereof are different, isolation between a travelling path of the transmission signal of the time division duplex system and a travelling path of the reception signal thereof can be obtained while maintaining the circuit size to be compact.

The high frequency front-end circuit of the present disclosure can further include a filter connected between the second antenna terminal and the third front-end terminal.

With this configuration, unwanted waves such as harmonics or the like of a reception signal inputted through the second antenna terminal are attenuated.

The high frequency front-end circuit of the present disclosure can include the third front-end terminal, a fourth front-end terminal, and a time division duplex communication duplexer circuit. The third front-end terminal is a terminal through which a reception signal of a first communication band of the time division duplex system is outputted. The fourth front-end terminal is a terminal through which a reception signal of a second communication band of the time division duplex system is outputted. The time division duplex communication duplexer circuit sends a reception signal of the first communication band of the time division duplex system inputted from the second antenna terminal to the third front-end terminal, and sends a reception signal of the second communication band of the time division duplex system inputted from the second antenna terminal to the fourth front-end terminal.

With this configuration, a reception signal of each of the communication bands of the time division duplex system can be separately received with low loss.

The front-end circuit of the present disclosure can include a transmission-reception circuit for a second communication signal group that transmits and receives communication signals of the second communication signal group whose frequencies in use are distanced from frequencies in use of a first communication signal group configured of communication signals of a plurality of communication bands that are inputted from the first front-end terminal and outputted from the second front-end terminal, and a duplexer circuit for general band division. The duplexer circuit for general band division is connected between the transmission-reception duplexer circuit and the first antenna terminal. The duplexer circuit for general band division separates transmission-reception signals of the first communication signal group and transmission-reception signals of the second communication signal group.

With this configuration, in the case where the communication bands of the frequency division duplex system are present across a wide frequency band, a communication band of the frequency division duplex system whose frequency is near the communication band of the time division duplex system and a communication band of the frequency division duplex system whose frequency is distanced from the communication band of the time division duplex system can be transmitted and received being separated.

The front-end circuit of the present disclosure may be configured as follows. A reception signal with respect to transmission signals of a plurality of communication bands inputted from the first front-end terminal is inputted to the second antenna terminal. The stated front-end circuit further includes fifth and sixth front-end terminals, a first switch circuit, and third and fourth frequency-variable filters. The fifth front-end terminal is a terminal through which reception signals of the first and second communication bands of the time division duplex system are outputted. The sixth front-end terminal is a terminal through which a reception signal of the same communication band as that of a reception signal outputted from the second front-end terminal is outputted. The first switch circuit is connected to the second antenna terminal, outputs a reception signal of the time division duplex system to the fifth front-end terminal, and outputs a reception signal of the frequency division duplex system to the sixth front-end terminal. The third frequency-variable filter is connected between the first switch circuit and the fifth front-end terminal. The fourth frequency-variable filter is connected between the first switch circuit and the sixth front-end terminal.

With this configuration, the first antenna terminal can be used as a terminal connected to a primary antenna with respect to a reception signal of a communication band of the frequency division duplex system, and the second antenna terminal can be used as a terminal connected to a reception antenna of a communication band of the time division duplex system while using the second antenna terminal as a terminal connected to a secondary antenna. Primary and secondary antennas are provided in some case in a wireless communication terminal that carries out transmission-reception operation using communication bands of the frequency division duplex system. This configuration makes it possible, by making use of the above-discussed antennas, to also receive a communication band of the time division duplex system and suppress an increase in size of the circuit.

The front-end circuit of the present disclosure can further include a second switch circuit configured to selectively connect the first front-end terminal and the fifth front-end terminal to a seventh front-end terminal.

This configuration makes it possible to lessen the number of external connection terminals of the front-end circuit and simplify the connection configuration with ICs for transmission-reception operation connected to these terminals.

The front-end circuit of the present disclosure can further include a transmission-side amplification circuit connected to the first front-end terminal.

This configuration makes it possible to configure the front-end circuit including the transmission-side amplification circuit in a small size.

The front-end circuit of the present disclosure can further include a reception-side amplification circuit connected to the second front-end terminal.

This configuration makes it possible to configure the front-end circuit including the transmission-side and reception-side amplification circuits in a small size.

A communication device of the present disclosure includes the aforementioned high frequency front-end circuit and an RFIC to which a transmission-side amplification circuit is connected.

This configuration makes it possible to configure the communication device in a small size by including the aforementioned front-end circuit configuration.

A communication device of the present disclosure includes the aforementioned high frequency front-end circuit and an RFIC to which a reception-side amplification circuit is connected.

This configuration makes it possible to configure the communication device in a miniaturized manner by including the aforementioned front-end circuit configuration.

A high frequency front-end circuit of the present disclosure includes a first antenna terminal, a first front-end terminal, a second front-end terminal, a transmission-reception duplexer circuit, a first frequency-variable filter, a second antenna terminal, and a third front-end terminal. A reception signal of a communication band of a time division duplex system and a reception signal of a communication band of a frequency division duplex system are inputted through the first antenna terminal, and a transmission signal of a communication band of the frequency division duplex system is outputted through the first antenna terminal. A reception signal of a communication band of the time division duplex system and a reception signal of a communication band of the frequency division duplex system are outputted through the first front-end terminal. A transmission signal of a communication band of the frequency division duplex system is inputted through the second front-end terminal. The transmission-reception duplexer circuit sends the transmission signal inputted from the second front-end terminal to the first antenna terminal, and sends the reception signals inputted from the first antenna terminal to the first front-end terminal. The first frequency-variable filter is connected between the first front-end terminal and the transmission-reception duplexer circuit or included in the transmission-reception duplexer circuit. A transmission signal of a communication band of the time division duplex system is inputted through the second antenna terminal. A transmission signal of a communication band of the time division duplex system is outputted through the third front-end terminal. Further, the first frequency-variable filter passes a reception signal of a communication band of the frequency division duplex system and a reception signal of a communication band of the time division duplex system, and attenuates signals other than the reception signal of the communication band of the frequency division duplex system and the reception signal of the communication band of the time division duplex system.

With this configuration, like the above-described configuration, the communication bands of the frequency division duplex system and the communication bands of the time division duplex system can be transmitted and received, and the circuit size can be maintained to be compact even if the number of communication bands increases.

According to the present disclosure, a front-end circuit capable of transmitting and receiving communication bands of the frequency division duplex system and the time division duplex system can be configured in a small size.

DETAILED DESCRIPTION

Figure 1:
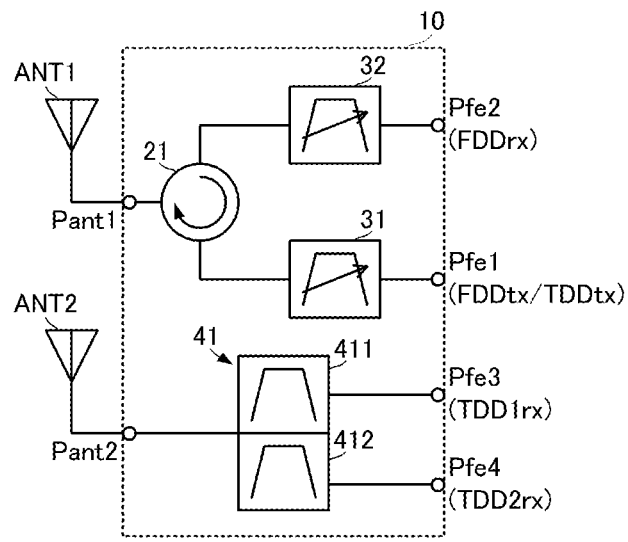
FIG. 1 is a circuit diagram of a front-end circuit according to a first embodiment of the present disclosure.

Hereinafter, a front-end circuit according to a first embodiment of the present disclosure will be described with reference to the drawings. FIG. 1 is a circuit diagram of a front-end circuit according to the first embodiment of the present disclosure.

A front-end circuit 10 includes antenna terminals Pant1 and Pant2, and front-end terminals Pfe1, Pfe2, Pfe3, and Pfe4. The antenna terminal Pant1 corresponds to a first antenna terminal of the present disclosure. The antenna terminal Pant2 corresponds to a second antenna terminal of the present disclosure. The front-end terminal Pfe1 corresponds to a first front-end terminal of the present disclosure. The front-end terminal Pfe2 corresponds to a second front-end terminal of the present disclosure. The front-end terminal Pfe3 corresponds to a third front-end terminal of the present disclosure. The front-end terminal Pfe4 corresponds to a fourth front-end terminal of the present disclosure.

The antenna terminal Pant1 is connected to an antenna ANT1. The antenna terminal Pant2 is connected to an antenna ANT2.

The front-end terminal Pfe1 is a terminal through which transmission signals of a plurality of communication bands of a time division duplex system and a plurality of communication bands of a frequency division duplex system are inputted. In other words, the front-end terminal Pfe1 is a terminal through which all the transmission signals that the front-end circuit 10 transmits are inputted.

The front-end terminal Pfe2 is a terminal through which a reception signal of a communication band of the frequency division duplex system is outputted. The front-end terminal Pfe3 is a terminal through which a reception signal of a first communication band of the time division duplex system is outputted. The front-end terminal Pfe4 is a terminal through which a reception signal of a second communication band of the time division duplex system is outputted.

The front-end circuit 10 includes a circulator 21, frequency-variable filters 31 and 32, and a separation unit 41. The separation unit 41 includes frequency-fixed filters 411 and 412. The circulator 21 corresponds to a "transmission-reception duplexer circuit" of the present disclosure. The separation unit 41 corresponds to a "time division duplex communication duplexer circuit" of the present disclosure.

The circulator 21 is connected to the antenna terminal Pant1, the frequency-variable filter 31, and the frequency-variable filter 32. The frequency-variable filter 31 is connected to the front-end terminal Pfe1. The frequency-variable filter 32 is connected to the front-end terminal Pfe2.

The circulator 21 sends a transmission signal from the frequency-variable filter 31 to the antenna terminal Pant1, and sends a reception signal from the antenna terminal Pant1 to the frequency-variable filter 32. The circulator 21 has a wide-band pass band that can pass transmission signals of a plurality of communication bands between the frequency-variable filter 31 and the antenna terminal Pant1 as well as between the antenna terminal Pant1 and the frequency-variable filter 32, and can send signals with low loss in the frequency bands of all the communication signals sent by the front-end circuit 10.

The frequency-variable filter 31 is a filter that passes a transmission signal within a communication band inputted to the front-end terminal Pfe1 from the external and attenuates harmonic frequency components or the like thereof. In the case where the transmission signal inputted to the front-end terminal Pfe1 is switched (in the case where the communication band is switched), the passing-through region and the attenuation region of the frequency-variable filter 31 are adjusted corresponding to the communication band of the transmission signal. With this configuration, the frequency-variable filter 31 serves as a filter common to the transmission signals of all the communication bands inputted from the front-end terminal Pfe1.

The frequency-variable filter 32 is a filter that passes a reception signal within a communication band (reception signal of a communication band of the frequency division duplex system) outputted from the front-end terminal Pfe2 to the external and attenuates harmonic frequency components or the like thereof. In the case where the reception signal to be outputted from the front-end terminal Pfe2 is switched (in the case where the communication band is switched), the passing-through region and the attenuation region of the frequency-variable filter 32 are adjusted corresponding to the reception signal. With this configuration, the frequency-variable filter 32 serves as a filter common to the reception signals of all the communication bands of the frequency division duplex system outputted from the front-end terminal Pfe2.

A shared terminal of the separation unit 41 is connected to the antenna terminal Pant2. An individual terminal of the frequency-fixed filter 411 of the separation unit 41 is connected to the front-end terminal Pfe3. The frequency-fixed filter 411 is a filter that passes a reception signal within a communication band of the first communication band of the time division duplex system and attenuates harmonic frequency components or the like thereof. An individual terminal of the frequency-fixed filter 412 of the separation unit 41 is connected to the front-end terminal Pfe4. The frequency-fixed filter 412 is a filter that passes a reception signal within a communication band of the second communication band of the time division duplex system and attenuates harmonic frequency components or the like thereof.

In the front-end circuit 10 having the above-described configuration, communication signals of the respective communication bands are transmitted and received in the manner as described below.

Transmission signals of all the communication bands are inputted from the front-end terminal Pfe1, and experience a filtering process in the frequency-variable filter 31. The transmission signal having experienced the filtering process is outputted from the antenna terminal Pant1 through the circulator 21, and then is radiated from the antenna ANT1 to the exterior.

Reception signals of all the communication bands of the frequency division duplex system received by the antenna ANT1 pass through the antenna terminal Pant1 and the circulator 21, and then experience a filtering process in the frequency-variable filter 32. The reception signal having experienced the filtering process is outputted from the front-end terminal Pfe2. Although the antenna ANT1 also receives the reception signals of the communication bands of the time division duplex system, the received reception signals are blocked by the frequency-variable filter 32 and are not sent to the front-end terminal Pfe2.

Reception signals of communication bands of the time division duplex system received by the antenna ANT2 are inputted to the separation unit 41 through the antenna terminal Pant2. The reception signal of the first communication band of the time division duplex system passes through the frequency-fixed filter 411 and is outputted from the front-end terminal Pfe3. The reception signal of the first communication band of the time division duplex system is blocked by the frequency-fixed filter 412 and is not sent to the front-end terminal Pfe4. The reception signal of the second communication band of the time division duplex system passes through the frequency-fixed filter 412 and is outputted from the front-end terminal Pfe4. The reception signal of the second communication band of the time division duplex system is blocked by the frequency-fixed filter 411 and is not sent to the front-end terminal Pfe3.

As discussed above, using the configuration of the present embodiment makes it possible to transmit and receive the communication bands of the frequency division duplex system and the time division duplex system, and miniaturize the circuit size even if the number of communication bands increases.

Further, the antenna for the transmission signal of the communication band of the time division duplex system and the antenna for the reception signal thereof are different, and a travelling path of the transmission signal of the communication band of the time division duplex system and a travelling path of the reception signal thereof are different. This makes it possible to obtain the isolation between the travelling path of the transmission signal of the time division duplex system and the travelling path of the reception signal thereof while reducing the circuit size by causing the circuit of the frequency division duplex system and the circuit of the time division duplex system to have a shared portion.

Furthermore, using the configuration of the present embodiment makes it possible to suppress an increase in size of the circuit even if the number of communication bands of the frequency division duplex system increases, because the transmission circuit and the reception circuit of the plurality of communication bands of the frequency division duplex system are configured by the same circuit. In addition, because the frequency-variable filters are disposed in transmission and reception paths of the communication bands of the frequency division duplex system, it is possible, without necessarily increasing the size of the circuit, to transmit and receive the signals of the respective communication bands with a high S/N ratio and with low loss.

In the configuration of the present embodiment, the filter disposed in the travelling path of the reception signal of the communication band of the time division duplex system is a frequency-fixed filter. Accordingly, the filtering process can be performed on the reception signal with low loss in comparison with a case of using a frequency-variable filter.

The above-discussed front-end circuit 10 can be configured of a multilayer body in which a circuit pattern is formed and a mounting-type electronic component mounted on the stated multilayer body.

A high frequency module may be configured as follows. That is, a transmission-side amplification circuit that amplifies a transmission signal is connected to the front end terminal Pfe1 of the front-end circuit 10; a first reception-side amplification circuit that amplifies a reception signal is connected to the front-end terminal Pfe2; and a second reception-side amplification circuit that amplifies a reception signal is connected to the front-end terminals Pfe3 and Pfe4. In this case, it is sufficient that a section of the front-end circuit 10 is configured of a multilayer body in which a circuit pattern is formed and a mounting-type electronic component mounted on the stated multilayer body, and that the transmission-side amplification circuit and the first and second reception-side amplification circuits are realized by a semiconductor element mounted on the multilayer body.

Moreover, a high frequency module may be configured by connecting an RFIC in charge of transmission-reception control to the front-end terminals Pfe1, Pfe2, Pfe3, and Pfe4 of the front-end circuit 10. In this case, it is sufficient that a section of the front-end circuit 10 is configured of a multilayer body in which a circuit pattern is formed and a mounting-type electronic component mounted on the stated multilayer body, and that the RFIC is realized by an IC chip mounted on the multilayer body.

Figure 2:
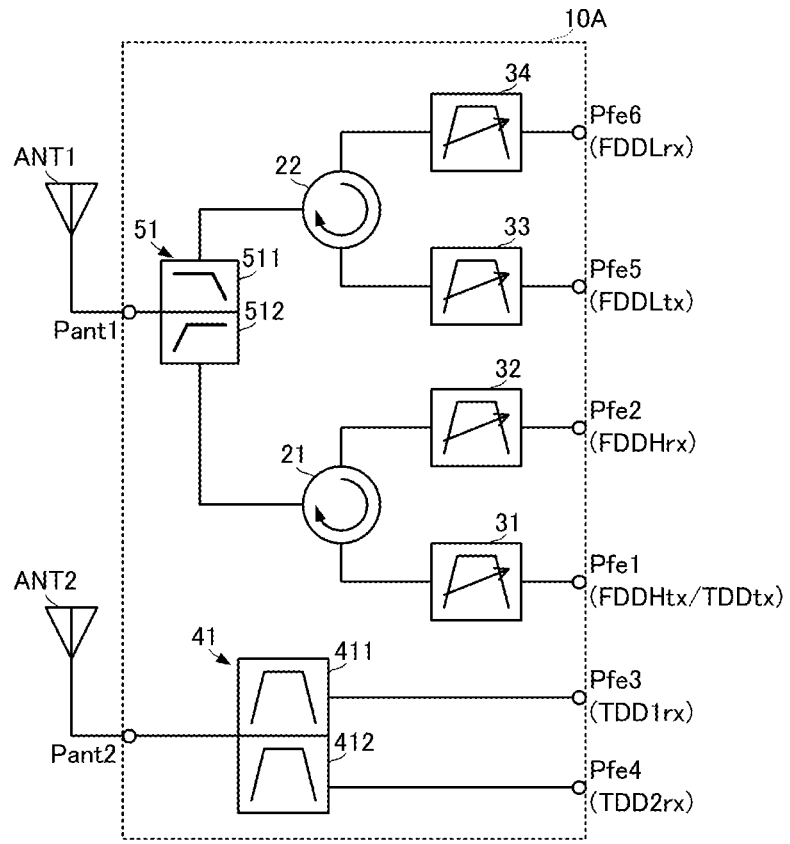
FIG. 2 is a circuit diagram of a front-end circuit according to a second embodiment of the present disclosure.

Next, a front-end circuit according to a second embodiment of the present disclosure will be described with reference to the drawings. FIG. 2 is a circuit diagram of a front-end circuit according to the second embodiment of the present disclosure.

A front-end circuit 10A according to the second embodiment is a circuit in which a circulator 22, frequency-variable filters 33 and 34, a diplexer 51, and front-end terminals Pfe5, Pfe6 are added to the front-end circuit 10 according to the first embodiment. The diplexer 51 corresponds to a "duplexer circuit for general band division" of the present disclosure.

In the front-end circuit 10A, the diplexer 51 is connected between the antenna terminal Pant1 and the circulator 21 as well as the circulator 22. To be more specific, the diplexer 51 includes a low pass filter 511 and a high pass filter 512. The high pass filter 512 is connected between the antenna terminal Pant1 and the circulator 21. The low pass filter 511 is connected between the antenna terminal Pant1 and the circulator 22.

The high pass filter 512 takes a high frequency band (for example, around 2 [GHz]) in the frequency band transmitted and received by the front-end circuit 10A as a pass band, and takes a low frequency band (for example, around 900 [MHz]) as an attenuation region. In contrast, the low pass filter 511 takes a low frequency band in the frequency band transmitted and received by the front-end circuit 10A as a pass band, and takes a high frequency band as an attenuation region.

The circulator 22 is connected to the low pass filter 511 of the diplexer 51, a frequency-variable filter 33, and a frequency-variable filter 34. The frequency-variable filter 33 is connected to the front-end terminal Pfe5. The front-end terminal Pfe5 is a terminal through which a transmission signal of a low frequency band of the frequency division duplex system is inputted. The front-end terminal Pfe5 can also be used as a terminal through which a transmission signal of the time division duplex system using a low frequency band is inputted. The frequency-variable filter 34 is connected to the front-end terminal Pfe6. The front-end terminal Pfe6 is a terminal through which a reception signal of a low frequency band of the frequency division duplex system is outputted.

The circulator 22 sends a transmission signal from the frequency-variable filter 33 to the low pass filter 511 of the diplexer 51, and sends a reception signal from the low pass filter 511 to the frequency-variable filter 34. The circulator 22 has a wide-band pass band, and can pass and send transmission-reception signals of a plurality of communication bands with low loss in a low frequency band of at least the frequency division duplex system between the frequency-variable filter 33 and the diplexer 51 and between the diplexer 51 and the frequency-variable filter 34.

The frequency-variable filter 33 is a filter that passes a communication band of a transmission signal inputted from the exterior to the front-end terminal Pfe5 and attenuates harmonic frequency components or the like thereof. When the transmission signal inputted to the front-end terminal Pfe5 is switched (when the communication band is switched), the passing-through region and the attenuation region of the frequency-variable filter 33 are adjusted corresponding to the transmission signal. With this configuration, the frequency-variable filter 33 serves as a filter common to the transmission signals of all the communication bands inputted from the front-end terminal Pfe5.

The frequency-variable filter 34 is a filter that passes a communication band of a reception signal (reception signal of a communication band of the frequency division duplex system) outputted from the front-end terminal Pfe6 to the exterior and attenuates harmonic frequency components or the like thereof. When the reception signal to be outputted from the front-end terminal Pfe6 is switched (when the communication band is switched), the passing-through region and the attenuation region of the frequency-variable filter 34 are adjusted corresponding to the reception signal. With this configuration, the frequency-variable filter 34 serves as a filter common to the reception signals of all the communication bands of the frequency division duplex system outputted from the front-end terminal Pfe6.

As discussed above, using the configuration of the present embodiment allows a transmission path of communication bands of the frequency division duplex system and a transmission path of communication bands of the time division duplex system to be configured of the same common path. With this, the front-end circuit capable of using the communication bands of the frequency division duplex system and the time division duplex system can be formed to be compact.

Further, using the configuration of the present embodiment makes it possible to suppress an increase in size of the circuit even if the number of communication bands of the frequency division duplex system increases not only in a frequency band used by the communication bands of the time division system but also in a frequency band distanced from the frequency band used by the communication bands of the time division duplex system. In addition, because the frequency-variable filters are disposed in the transmission and reception paths of the communication bands of the frequency division duplex system, it is possible, without necessarily increasing the size of the circuit, to transmit and receive the signals of the respective communication bands with a high signal to noise ratio and with low loss.

In the configuration of the present embodiment, like in the first embodiment, the filter disposed in the travelling path of the reception signal of the communication band of the time division duplex system is a frequency-fixed filter. Accordingly, the filtering process can be performed on the reception signal with low loss in comparison with a case of using a frequency-variable filter.

Figure 3:
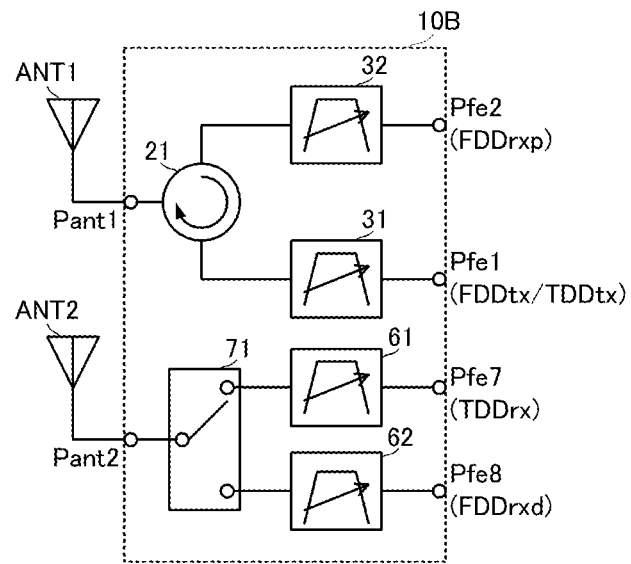
FIG. 3 is a circuit diagram of a front-end circuit according to a third embodiment of the present disclosure.

Next, a front-end circuit according to a third embodiment of the present disclosure will be described with reference to the drawings. FIG. 3 is a circuit diagram of a front-end circuit according to the third embodiment of the present disclosure.

A front-end circuit 10B according to the third embodiment differs from the front-end circuit 10 according to the first embodiment in that a circuit connected to an antenna terminal Pant2 is configured in a different manner.

The front-end circuit 10B includes the circulator 21 and the frequency-variable filters 31 and 32. These are the same as the circulator 21 and the frequency-variable filters 31 and 32 of the front-end circuit 10 according to the first embodiment.

The front-end circuit 10B includes frequency-variable filters 61 and 62, a switch circuit 71, and front-end terminals Pfe7 and Pfe8. The frequency-variable filter 61 corresponds to a third frequency-variable filter of the present disclosure and the frequency-variable filter 62 corresponds to a fourth frequency-variable filter of the present disclosure. The switch circuit 71 corresponds to a first switch circuit of the present disclosure. The front-end terminal Pfe7 corresponds to a fifth front-end terminal of the present disclosure and the front-end terminal Pfe8 corresponds to a sixth front-end terminal of the present disclosure.

The front-end terminal Pfe7 is a terminal through which a reception signal of a communication band of the time division duplex system is outputted. The front-end terminal Pfe8 is a terminal through which a reception signal of a communication band of the frequency division duplex system is outputted. In other words, the front-end terminal Pfe8 outputs the same reception signal as the front-end terminal Pfe2. The front-end terminal Pfe2 is a primary reception signal output terminal, while the front-end terminal Pfe8 is a secondary reception signal output terminal. In the case where the antenna ANT2 is used as a diversity antenna, a diversity reception signal is outputted from the front-end terminal Pfe8.

The switch circuit 71 includes a shared terminal and first and second selection target terminals. That is, the switch circuit 71 switches the shared terminal to be connected to one of the first and second selection target terminals.

The shared terminal of the switch circuit 71 is connected to the antenna terminal Pant2. The first selection target terminal of the switch circuit 71 is connected to the frequency-variable filter 61. The frequency-variable filter 61 is connected to the front-end terminal Pfe7. The second selection target terminal of the switch circuit 71 is connected to the frequency-variable filter 62. The frequency-variable filter 62 is connected to the front-end terminal Pfe8.

The frequency-variable filter 61 passes a communication band of a reception signal (reception signal of a communication band of the time division duplex system) to be outputted from the front-end terminal Pfe7 to the exterior, and attenuates harmonic frequency components or the like thereof. When the reception signal to be outputted from the front-end terminal Pfe7 is switched, the passing-through region and the attenuation region of the frequency-variable filter 61 are adjusted corresponding to the reception signal. With this configuration, the frequency-variable filter 61 serves as a filter common to the reception signals of all the communication bands of the time division duplex system outputted from the front-end terminal Pfe7. In the case where the communication band of the time division duplex system uses only one frequency, the frequency-variable filter 61 may be replaced with a frequency-fixed filter.

The frequency-variable filter 62 has the same function as the frequency-variable filter 32.

The front-end circuit 10B configured as discussed above operates in the following manner.

In the case where the transmission operation and reception operation are carried out using communication bands of the time division duplex system, the switch circuit 71 connects the shared terminal to the first selection target terminal. Through this, a reception signal of a communication band of the time division duplex system received by the antenna ANT2 passes through the switch circuit 71, experiences a filtering process in the frequency-variable filter 61, and is outputted from the front-end terminal Pfe7.

In the case where the transmission operation and reception operation are carried out using communication bands of the frequency division duplex system, the switch circuit 71 connects the shared terminal to the second selection target terminal. Through this, a reception signal of a communication band of the frequency division duplex system received by the antenna ANT2 passes through the switch circuit 71, experiences a filtering process in the frequency-variable filter 62, and is outputted from the front-end terminal Pfe8.

As discussed above, the front-end circuit 10B of the present embodiment can use the antenna ANT2, which is used as a secondary antenna (diversity antenna) in the communication bands of the frequency division duplex system, for receiving the communication bands of the time division duplex system.

This makes it possible to improve sensitivity in receiving the communication bands of the frequency division duplex system, in addition to obtaining the action effects as described in the first embodiment.

In the case where the frequency band of the communication bands of the time division duplex system and the frequency band of the communication bands of the frequency division duplex system are distanced to the extent that they can be isolated from each other by the filters, a duplexer circuit such as a duplexer using an inductor and a capacitor, a duplexer using a SAW filter, or the like may be used in place of the switch circuit 71.

Figure 4:
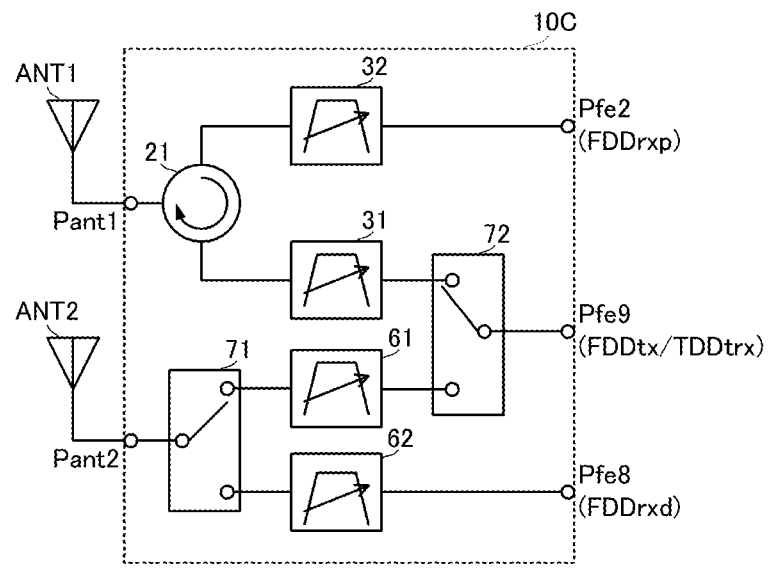
FIG. 4 is a circuit diagram of a front-end circuit according to a fourth embodiment of the present disclosure.
Figure 5:
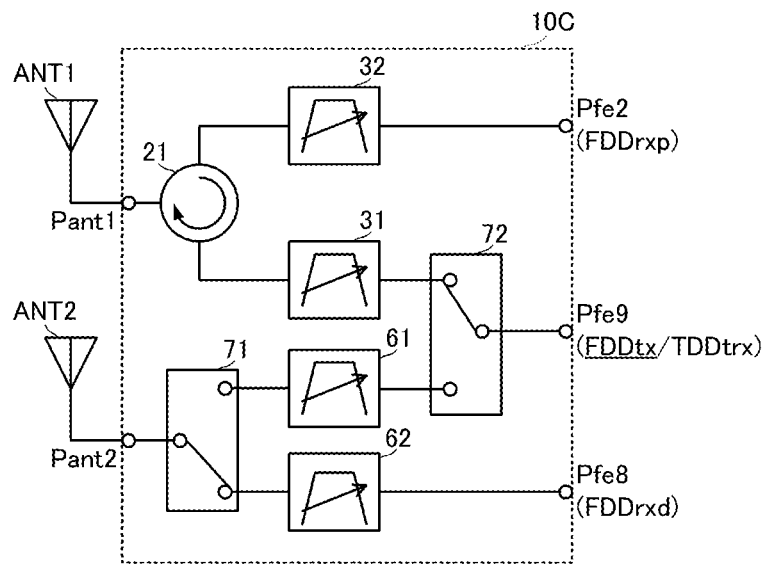
FIG. 5 is a circuit diagram of the front-end circuit according to the fourth embodiment of the present disclosure at a time when communication bands of a frequency division duplex system are transmitted and received.
Figure 6:
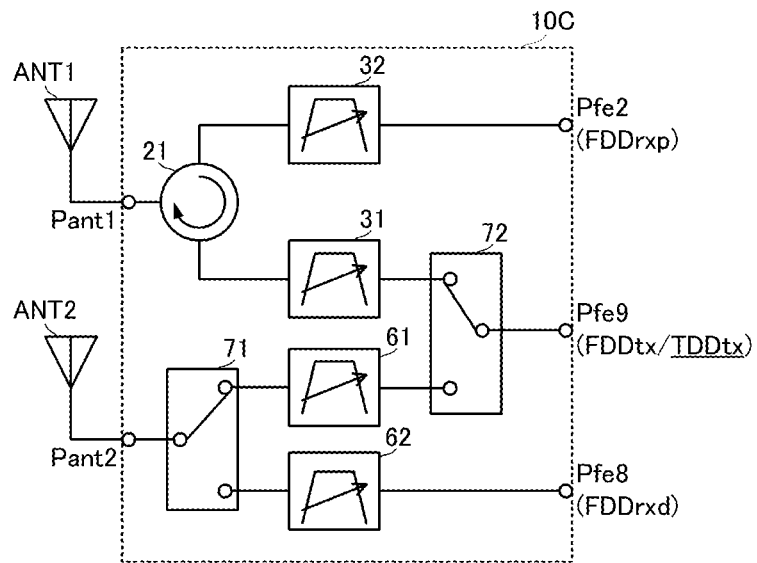
FIG. 6 is a circuit diagram of the front-end circuit according to the fourth embodiment of the present disclosure at a time when a communication band of a time division duplex system is transmitted.
Figure 7:
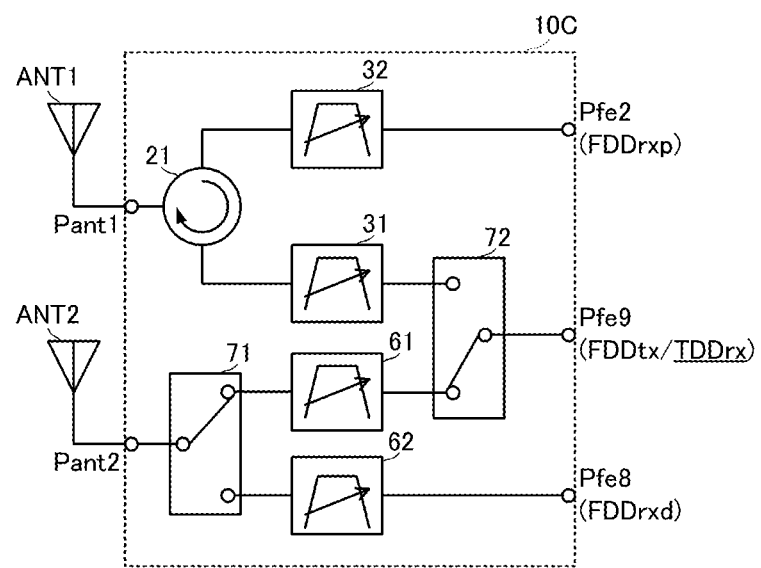
FIG. 7 is a circuit diagram of the front-end circuit according to the fourth embodiment of the present disclosure at a time when a communication band of the time division duplex system is received.

Next, a front-end circuit according to a fourth embodiment of the present disclosure will be described with reference to the drawings. FIG. 4 is a circuit diagram of a front-end circuit according to the fourth embodiment of the present disclosure. FIG. 5 is a circuit diagram of the front-end circuit according to the fourth embodiment of the present disclosure at a time when communication bands of the frequency division duplex system are transmitted and received. FIG. 6 is a circuit diagram of the front-end circuit according to the fourth embodiment of the present disclosure at a time when a communication band of the time division duplex system is transmitted. FIG. 7 is a circuit diagram of the front-end circuit according to the fourth embodiment of the present disclosure at a time when a communication band of the time division duplex system is received.

A front-end circuit 10C according to the fourth embodiment is a circuit in which a switch circuit 72 and a front-end terminal Pfe9 are added to the front-end circuit 10B according to the third embodiment, and front-end terminals Pfe1 and Pfe7 are further incorporated. The switch circuit 72 corresponds to a second switch circuit of the present disclosure. The front-end terminal Pfe9 corresponds to a seventh front-end terminal of the present disclosure.

The switch circuit 72 includes a shared terminal and first and second selection target terminals. The switch circuit 72 switches the shared terminal to be connected to one of the first and second selection target terminals. The first selection target terminal of the switch circuit 72 corresponds to the front-end terminal Pfe1 according to the third embodiment. The second selection target terminal of the switch circuit 72 corresponds to the front-end terminal Pfe7 according to the third embodiment.

The front-end terminal Pfe9 is an input terminal of a transmission signal of a communication band of the frequency division duplex system. Further, the front-end terminal Pfe9 is an input terminal of a transmission signal of a communication band of the time division duplex system and is also an output terminal of a reception signal thereof.

The front-end circuit 10C configured as discussed above operates in the following manner.

(Transmission and Reception of Communication Band of Frequency Division System)

As shown in FIG. 5, in the case where communication bands of the frequency division duplex system are transmitted and received, the switch circuit 71 connects the antenna terminal Pant2 and the frequency-variable filter 62. The switch circuit 72 connects the front-end terminal Pfe9 and a frequency-variable filter 31.

A transmission signal of a communication band of the frequency division duplex system is inputted from the front-end terminal Pfe9, passes through the switch circuit 72, and experiences a filtering process in the frequency-variable filter 31. The transmission signal having experienced the filtering process is sent to an antenna terminal Pant1 through the circulator 21 and radiated to the exterior from the antenna ANT1.

Reception signals of communication bands of the frequency division duplex system are received by the antenna ANT1 and the antenna ANT2. The antenna ANT1 is a primary antenna while the antenna ANT2 is a secondary antenna (diversity antenna).

A reception signal received by the antenna ANT1 is inputted from the antenna terminal Pant1. The reception signal passes through the circulator 21, experiences a filtering process in a frequency-variable filter 32, and is outputted as a primary reception signal from a front-end terminal Pfe2.

A reception signal received by the antenna ANT2 is inputted from the antenna terminal Pant2. The reception signal passes through the switch circuit 71, experiences a filtering process in the frequency-variable filter 62, and is outputted as a diversity reception signal from a front-end terminal Pfe8.

(Transmission of Communication Band of Time Division System)

As shown in FIG. 6, in the case where a communication band of the time division duplex system is transmitted, the switch circuit 72 connects the front-end terminal Pfe9 and the frequency-variable filter 31. The switch circuit 71 may connect a shared terminal thereof to one of frequency-variable filters 61 and 62, and not to connect the shared terminal to any of the frequency-variable filters 61 and 62 if a non-connection state can be realized in the configuration.

A transmission signal of a communication band of the time division duplex system is inputted from the front-end terminal Pfe9, passes through the switch circuit 72, and experiences a filtering process in the frequency-variable filter 31. The transmission signal having experienced the filtering process is sent to the antenna terminal Pant1 through the circulator 21 and radiated to the exterior from the antenna ANT1.

(Reception of Communication Band of Time Division System)

As shown in FIG. 7, in the case where a communication band of the time division duplex system is received, the switch circuit 71 connects the antenna terminal Pant2 and the frequency-variable filter 61. The switch circuit 72 connects the front-end terminal Pfe9 and the frequency-variable filter 61.

A reception signal of a communication band of the time division duplex system is received by the antenna ANT2. The reception signal received by the antenna ANT2 is inputted from the antenna terminal Pant2. The reception signal passes through the switch circuit 71 and experiences a filtering process in the frequency-variable filter 61. The reception signal having experienced the filtering process passes through the switch circuit 72 and is outputted from the front-end terminal Pfe9.

By using the configuration of the present embodiment in the manner discussed above, the number of external terminals of the front-end circuit 10C can be lessened. This makes it possible to simplify the connection configuration with an IC for transmission-reception operation connected to the front-end circuit 10C. Thus, a front-end module including the IC for transmission-reception operation and the front-end circuit 10C can be miniaturized.

Figure 8:
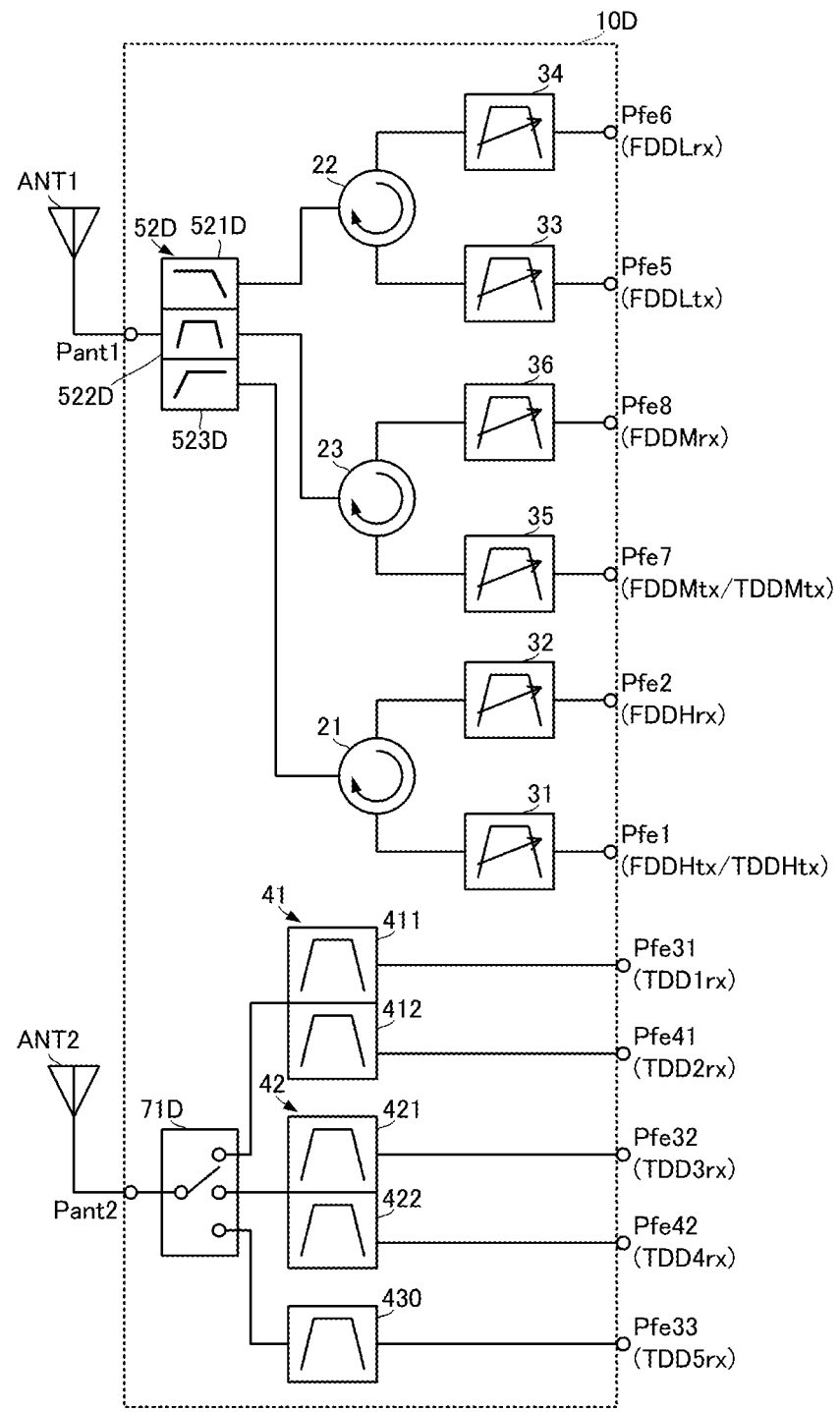
FIG. 8 is a circuit diagram of a front-end circuit according to a fifth embodiment of the present disclosure.

Next, a front-end circuit according to a fifth embodiment of the present disclosure will be described with reference to the drawings. FIG. 8 is a circuit diagram of a front-end circuit according to the fifth embodiment of the present disclosure.

A front-end circuit 10D according to the fifth embodiment differs from the front-end circuit 10A according to the second embodiment in a point that a triplexer 52D is used while a communication band being divided into three pieces including a high region, a middle region, and a low region; meanwhile in the front-end circuit 10A, the diplexer 51 is used while a communication band being divided into two pieces including a high region and a low region. Note that in the front-end circuit 10D, the high region refers to a frequency range of no less than 2.3 [GHz], the middle region refers to a frequency range from 1.4 [GHz] to 2.2 [GHz], and the low region refers to a frequency range of no more than 1.0 [GHz]. The number of communication bands of the time division duplex system transmitted and received in the front-end circuit 10D is larger than that in the front-end circuit 10A. Basic characteristics of the respective circuit elements are the same as those of the front-end circuit 10A, and set values of the elements are appropriately made different in accordance with the present specifications. In order to carry out the transmission operation and reception operation in accordance with the present specifications, the front-end circuit 10D is configured in the following manner.

The front-end circuit 10D includes antenna terminals Pant1 and Pant2, and front-end terminals Pfe1, Pfe2, Pfe5, Pfe6, Pfe7, Pfe8, Pfe31, Pfe32, Pfe33, Pfe41 and Pfe42.

The antenna terminal Pant1 is connected to an antenna ANT1. The antenna terminal Pant2 is connected to an antenna ANT2.

The front-end terminal Pfe1 is a terminal through which transmission signals of a plurality of communication bands of the time division duplex system in the high region and a plurality of communication bands of the frequency division duplex system in the high region are inputted. The front-end terminal Pfe2 is a terminal through which a reception signal of a communication band of the frequency division duplex system in the high region is outputted.

The front-end terminal Pfe5 is a terminal through which transmission signals of a plurality of communication bands of the frequency division duplex system in the low region are inputted. The front-end terminal Pfe6 is a terminal through which reception signals of a plurality of communication bands of the frequency division duplex system in the low region are outputted.

The front-end terminal Pfe7 is a terminal through which transmission signals of a plurality of communication bands of the time division duplex system in the middle region and a plurality of communication bands of the frequency division duplex system in the middle region are inputted. The front-end terminal Pfe8 is a terminal through which a reception signal of a communication band of the frequency division duplex system in the middle region is outputted.

The front-end terminals Pfe31, Pfe32, Pfe33, Pfe41, and Pfe42 are terminals through which reception signals of communication bands of the time division duplex system respectively using different frequency bands are outputted.

The front-end circuit 10D includes circulators 21, 22 and 23, frequency-variable filters 31, 32, 33, 34, 35 and 36, duplexers 41 and 42, frequency-fixed filters 411, 412, 421, 422 and 430, the triplexer 52D corresponding to a "duplexer circuit for general band division", and a switch circuit 71D. The triplexer 52D is configured of a low pass filter 521D, a band pass filter 522D, and a high pass filter 523D.

The antenna terminal Pant1 is connected to a shared terminal of the triplexer 52D. The low pass filter 521D of the triplexer 52D is connected to the circulator 22. The band pass filter 522D is connected to the circulator 23. The high pass filter 523D is connected to the circulator 21. To rephrase, the antenna terminal Pant1 is connected to the circulator 22 with the low pass filter 521D interposed therebetween. The antenna terminal Pant1 is connected to the circulator 23 with the band pass filter 522D interposed therebetween. The antenna terminal Pant1 is connected to the circulator 21 with the high pass filter 523D interposed therebetween. The low pass filter 521D, the band pass filter 522D, and the high pass filter 523D configuring the triplexer 52D are a frequency-fixed type filter, which is realized by combining an inductor and a capacitor, for example.

The frequency-variable filter 31 is connected between the circulator 21 and the front-end terminal Pfe1. The frequency-variable filter 32 is connected between the circulator 21 and the front-end terminal Pfe2. The frequency-variable filter 33 is connected between the circulator 22 and the front-end terminal Pfe5. The frequency-variable filter 34 is connected between the circulator 22 and the front-end terminal Pfe6. The frequency-variable filter 35 is connected between the circulator 23 and the front-end terminal Pfe7. The frequency-variable filter 36 is connected between the circulator 23 and the front-end terminal Pfe8.

The antenna terminal Pant2 is connected to a shared terminal of the switch circuit 71D. A first selection target terminal of the switch circuit 71D is connected to the duplexer 41. A second selection target terminal of the switch circuit 71D is connected to the duplexer 42. A third selection target terminal of the switch circuit 71D is connected to the band pass-type frequency-fixed filters 430. The duplexer 41 is configured of the frequency-fixed filter 411 and the frequency-fixed filter 412. The frequency-fixed filter 411 is connected to the front-end terminal Pfe31. The frequency-fixed filter 412 is connected to the front-end terminal Pfe41. The duplexer 42 is configured of the frequency-fixed filter 421 and the frequency-fixed filter 422. The frequency-fixed filter 421 is connected to the front-end terminal Pfe32. The frequency-fixed filter 422 is connected to the front-end terminal Pfe42. The frequency-fixed filter 430 is connected to the front-end terminal Pfe33.

In this configuration, in the middle and high regions, a travelling path of a transmission signal of the frequency division duplex system and a travelling path of a transmission system of the time division duplex system are configured by the same common path. With this, the front-end circuit capable of using communication bands of the frequency division duplex system and communication bands of the time division duplex system can be formed to be compact like in the above-discussed embodiment.

Further, the filters to the transmission and reception signals of the communication bands of the frequency division duplex system are frequency-variable filters, thereby making it possible to suppress an increase in the number of filters due to an increase in the number of bands. With this, even if the number of communication bands increases, an increase in the circuit size of the front-end circuit can be suppressed.

Figure 9:
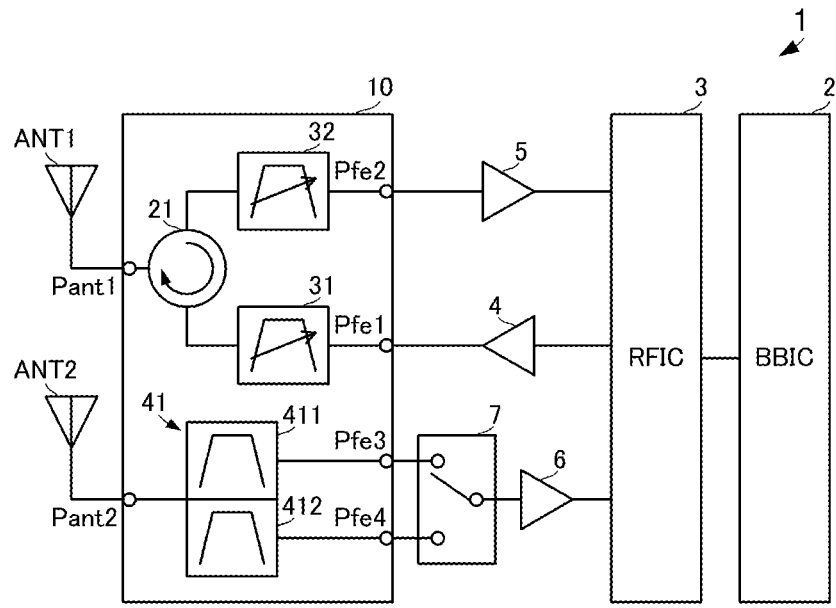
FIG. 9 is a circuit block diagram of a communication device according to a sixth embodiment of the present disclosure.

Next, a communication device according to a sixth embodiment of the present disclosure will be described with reference to the drawings. FIG. 9 is a circuit block diagram of a communication device according to the sixth embodiment of the present disclosure.

As shown in FIG. 9, a communication device 1 includes a BBIC2, an RFIC3, a transmission-side amplification circuit 4, reception-side amplification circuits 5 and 6, a switch circuit 7, and a front-end circuit 10.

The front-end circuit 10 has the circuit configuration as described in the first embodiment. A front-end terminal Pfe1 is connected to an output end of the transmission-side amplification circuit 4. An input end of the transmission-side amplification circuit 4 is connected to the RFIC3. A front-end terminal Pfe2 is connected to an input end of the reception-side amplification circuit 5. An output end of the reception-side amplification circuit 5 is connected to the RFIC3. Front-end terminals Pfe3 and Pfe4 are respectively connected to selection target terminals of the switch circuit 7. The selection target terminal to which the front-end terminal Pfe3 is connected and the selection target terminal to which the front-end terminal Pfe4 is connected are different terminals, and are selectively connected to a shared terminal of the switch circuit 7. The shared terminal of the switch circuit 7 is connected to an input end of the reception-side amplification circuit 6. An output end of the reception-side amplification circuit 6 is connected to the RFIC3. The RFIC3 is connected to the BBIC2.

The BBIC2 performs signal processing in a base band frequency region of the communication device 1. The RFIC3 performs signal processing in a high frequency region of the communication device 1.

The RFIC3 generates transmission signals of the frequency division duplex system and the time division duplex system and outputs the generated signals to the transmission-side amplification circuit 4. The RFIC3 demodulates reception signals respectively inputted from the reception-side amplification circuits 5 and 6.

The transmission-side amplification circuit 4 has wide-band amplification characteristics, and amplifies, with high efficiency, transmission signals of a plurality of communication bands of the frequency division duplex system and the time division duplex system to be transmitted by the high frequency front-end circuit 10. The reception-side amplification circuit 5 has wide-band amplification characteristics, and amplifies, with high efficiency, reception signals of a plurality of communication bands of the frequency division duplex system received by the high frequency front-end circuit 10. The reception-side amplification circuit 6 has wide-band amplification characteristics, and amplifies, with high efficiency, reception signals of a plurality of communication bands of the time division duplex system received by the high frequency front-end circuit 10. This makes it possible to miniaturize the circuit size in comparison with a case where amplification circuits are disposed for each of the communication bands.

With the communication device 1 configured as discussed above, using the front-end circuit 10 of the above-described configuration makes it possible to configure a communication device that is compact, and transmits and receives communication bands of the frequency division duplex system and communication bands of the time division duplex system.

The transmission-side amplification circuit 4, the reception-side amplification circuits 5 and 6, and the switch circuit 7 of the present embodiment may be mounted in a multilayer body configuring the high frequency front-end circuit 10, and the circuit configured of these constituent elements may be taken as a high frequency front-end circuit.

In the present embodiment, a mode in which the front-end circuit 10 is used has been described. However, other front-end circuits, that is, the front-end circuits 10A, 10B, 10C and 10D discussed above, and front-end circuits 10E and 10F to be explained later may be used instead. In this case, it is sufficient that the transmission-side amplification circuit, the reception-side amplification circuits, and the circuit on the RFIC side are configured in accordance with the number of front-end terminals or the like in each of the front-end circuits.

Figure 10:
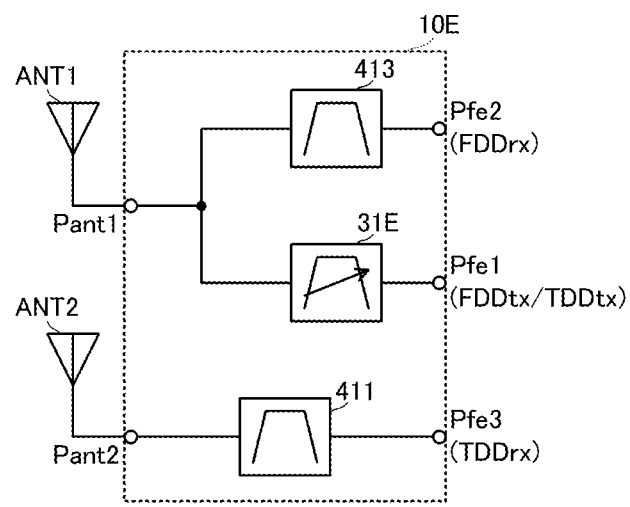
FIG. 10 is a circuit diagram of a front-end circuit according to a seventh embodiment of the present disclosure.

Next, a front-end circuit according to a seventh embodiment of the present disclosure will be described with reference to the drawings. FIG. 10 is a circuit diagram of a front-end circuit according to the seventh embodiment of the present disclosure.

A front-end circuit 10E according to the seventh embodiment is a circuit configured as follows. That is, in the front-end circuit 10 according to the first embodiment, the circulator 21 and the front-end terminal Pfe4 are omitted, the filter for a reception signal of a communication band of the frequency division duplex system is changed to a frequency-fixed filter 413, and the frequency-fixed filter 411 is used in place of the duplexer 41.

An antenna terminal Pant1 is connected to a frequency-variable filter 31E and the frequency-fixed filter 413. A pair of the frequency-variable filter 31E and the frequency-fixed filter 413 corresponds to a "transmission-reception duplexer circuit" of the present disclosure. The frequency-variable filter 31E is connected to a front-end terminal Pfe1. The frequency-fixed filter 413 is connected to a front-end terminal Pfe2.

The front-end terminal Pfe1 is a terminal through which transmission signals of communication bands of the time division duplex system and the frequency division duplex system are inputted. The front-end terminal Pfe2 is a terminal through which a reception signal of a communication band of the frequency division duplex system is outputted. The number of communication bands of each of the time division duplex system and frequency division duplex system is appropriately set in accordance with the specifications.

An antenna terminal Pant2 is connected to the frequency-fixed filter 411. The frequency-fixed filter 411 is connected to the front-end terminal Pfe3. The front-end terminal Pfe3 is a terminal through which a reception signal of a communication band of the time division duplex system is outputted.

Also with this configuration, the same action effects as those of the above-described embodiment can be obtained. Further, with the configuration of the present embodiment, constituent elements configuring the front-end circuit 10E are lessened, thereby making it possible to further miniaturize the front-end circuit.

Note that a transmission signal consumes more power than a reception signal. As such, a filter for a transmission signal is generally larger than a filter for a reception signal. Therefore, in the front-end circuit according to the aforementioned embodiments, a mode in which a filter for a transmission signal of a communication band of the frequency division duplex system serves as a filter for a transmission signal of a communication band of the time division duplex system at the same time can miniaturize the front-end circuit more effectively than a mode in which a filter for a reception signal is shared.

Figure 11:
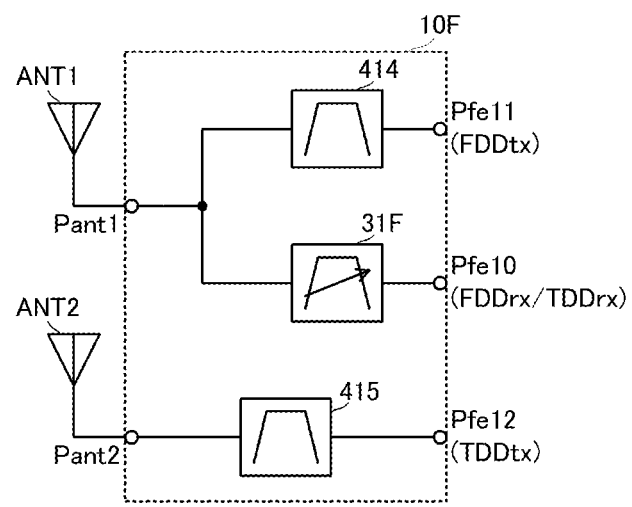
FIG. 11 is a circuit diagram of a front-end circuit according to an eighth embodiment of the present disclosure.

Next, a front-end circuit according to an eighth embodiment of the present disclosure will be described with reference to the drawings. FIG. 11 is a circuit diagram of a front-end circuit according to the eighth embodiment of the present disclosure.

A front-end circuit 10F according to the eighth embodiment is a front-end circuit in which a connection relationship among antenna terminals, front-end terminals, and filters is different from that in the front-end circuit 10E according to the seventh embodiment.

An antenna terminal Pant1 is connected to a frequency-variable filter 31F and a frequency-fixed filter 414. A pair of the frequency-variable filter 31F and the frequency-fixed filter 414 corresponds to a "transmission-reception duplexer circuit" of the present disclosure. The frequency-variable filter 31F is connected to a front-end terminal Pfe10. The frequency-fixed filter 414 is connected to a front-end terminal Pfe11. The front-end terminal Pfe10 is a terminal through which reception signals of communication bands of the time division duplex system and frequency division duplex system are outputted. The front-end terminal Pfe11 is a terminal through which a transmission signal of a communication band of the frequency division duplex system is inputted.

The antenna terminal Pant2 is connected to a frequency-fixed filter 415. The frequency-fixed filter 415 is connected to a front-end terminal Pfe12. The front-end terminal Pfe12 is a terminal through which a transmission signal of a communication band of the time division duplex system is inputted.

Also with this configuration, the same action effects as those of the front-end circuit 10E according to the seventh embodiment can be obtained.

The same circulator 21 as that of the first embodiment may be connected between the antenna terminal Pant1 and the frequency-variable filter 31E as well as the frequency-fixed filter 413 in the front-end circuit 10E according to the seventh embodiment, and between the antenna terminal Pant1 and the frequency-variable filter 31F as well as the frequency-fixed filter 414 in the front-end circuit 10F according to the eighth embodiment. In this case, the circulator 21 corresponds to a "transmission-reception duplexer circuit" of the present disclosure.

REFERENCE SIGNS LIST

1 COMMUNICATION DEVICE
2 BBIC
3 RFIC
4 TRANSMISSION-SIDE AMPLIFICATION CIRCUIT
5,6 RECEPTION-SIDE AMPLIFICATION CIRCUIT
7 SWITCH CIRCUIT
10, 10A, 10B, 10C, 10D, 10E, 10F FRONT-END CIRCUIT
21, 22, 23 CIRCULATOR
31, 32, 33, 34, 35, 36, 31E, 31F FREQUENCY-VARIABLE FILTER 41, 42 DUPLEXER
51 DIPLEXER
51D TRIPLEXER
61, 62 FREQUENCY-VARIABLE FILTER
71, 72 SWITCH CIRCUIT
411, 412, 413, 414, 415, 421, 422, 430 FREQUENCY-FIXED FILTER
511 LOW PASS FILTER
512 HIGH PASS FILTER
ANT1, ANT2 ANTENNA
Pfe1, Pfe2, Pfe3, Pfe4, Pfe5, Pfe6, Pfe7, Pfe8, Pfe9, Pfe10, Pfe11, Pfe12 FRONT-END TERMINAL

The invention claimed is:

1. A high frequency front-end circuit comprising:
   a first antenna terminal through which a transmission signal of a time division duplex system and a transmission signal of a frequency division duplex system are outputted, and a reception signal of the frequency division duplex system is inputted;
   a first front-end terminal through which the transmission signal of the time division duplex system and the transmission signal of the frequency division duplex system are inputted;
   a second front-end terminal through which the reception signal of the frequency division duplex system is outputted;
   a transmission-reception duplexer circuit that sends the transmission signals inputted through the first front-end terminal to the first antenna terminal, and sends the reception signal inputted through the first antenna terminal to the second front-end terminal;
   a first frequency-variable filter that is connected between the first front-end terminal and the transmission-reception duplexer circuit or included in the transmission-reception duplexer circuit;
   a second antenna terminal through which a first reception signal of a first communication band of the time division duplex system is inputted; and
   a third front-end terminal through which the first reception signal of the time division duplex system is outputted,
   wherein the first frequency-variable filter passes the transmission signal of the frequency division duplex system and the transmission signal of the time division duplex system, and
   the first frequency-variable filter attenuates signals other than the transmission signal of the frequency division duplex system and the transmission signal of the time division duplex system.

2. The high frequency front-end circuit according to claim 1, further comprising:
   a filter connected between the second antenna terminal and the third front-end terminal.

3. The high frequency front-end circuit according to claim 1, further comprising:
   a fourth front-end terminal through which a second reception signal of a second communication band of the time division duplex system is outputted; and
   a time division duplexer circuit that sends the first reception signal of the time division duplex system to the third front-end terminal, and sends the second reception signal of the second communication band of the time division duplex system to the fourth front-end terminal.

4. The high frequency front-end circuit according to claim 1, wherein
   a first communication signal group comprises the transmission signals inputted from the first front-end terminal and the reception signal outputted from the second front-end terminal,
   a second communication signal group comprises transmission and reception signals whose frequencies are different from the transmission and reception signals of the first communication signal group, and
   the high frequency front-end circuit further comprises:
   a transmission-reception circuit for the second communication signal group and that transmits and receives the communication signals of the second communication signal group; and
   a duplexer circuit connected between the transmission-reception duplexer circuit and the first antenna terminal, the duplexer circuit separating the transmission and reception signals of the first communication signal group and the transmission and reception signals of the second communication signal group.

5. The high frequency front-end circuit according to claim 1, further comprising:
   a fifth front-end terminal through which the first reception signal of the time division duplex system and a second reception signal of a second communication band of the time division duplex system, are outputted;
   a sixth front-end terminal through which a reception signal having a same communication band as the reception signal of the frequency division duplex system outputted from the second front-end terminal, is outputted;
   a first switch circuit that is connected to the second antenna terminal, outputs the first or second reception signal of the time division duplex system to the fifth front-end terminal, and outputs the reception signal of the frequency division duplex system to the sixth front-end terminal;
   a third frequency-variable filter that is connected between the first switch circuit and the fifth front-end terminal; and
   a fourth frequency-variable filter that is connected between the first switch circuit and the sixth front-end terminal.

6. The high frequency front-end circuit according to claim 5, further comprising:
   a second switch circuit configured to selectively connect the first front-end terminal and the fifth front-end terminal to a seventh front-end terminal.

7. The high frequency front-end circuit according to claim 1, further comprising:
   a transmission-side amplification circuit connected to the first front-end terminal.

8. The high frequency front-end circuit according to claim 7, further comprising:
   a reception-side amplification circuit connected to the second front-end terminal.

9. A communication device comprising:
   the high frequency front-end circuit according to claim 7; and
   a radio frequency integrated circuit (RFIC) to which the transmission-side amplification circuit is connected.

10. A communication device comprising:
    the high frequency front-end circuit according to claim 8; and
    a radio frequency integrated circuit (RFIC) to which the transmission-side amplification circuit and the reception-side amplification circuit are connected.

11. A high frequency front-end circuit comprising:
a first antenna terminal through which a reception signal of a first communication band of a time division duplex system and a reception signal of a frequency division duplex system are inputted, and a transmission signal of the frequency division duplex system is outputted;
a first front-end terminal through which the reception signal of the time division duplex system and the reception signal of the frequency division duplex system are outputted;
a second front-end terminal through which the transmission signal of the frequency division duplex system is inputted;
a transmission-reception duplexer circuit that sends the transmission signal inputted from the second front-end terminal to the first antenna terminal, and sends the reception signals inputted from the first antenna terminal to the first front-end terminal;
a first frequency-variable filter that is connected between the first front-end terminal and the transmission-reception duplexer circuit or included in the transmission-reception duplexer circuit;
a second antenna terminal through which a transmission signal of the time division duplex system is inputted; and
a third front-end terminal through which the transmission signal of the time division duplex system is outputted,
wherein the first frequency-variable filter passes the reception signal of the frequency division duplex system and the reception signal of the time division duplex system, and
the first frequency-variable filter attenuates signals other than the reception signal of the frequency division duplex system and the reception signal of the time division duplex system.

* * * * *